(12) United States Patent
Chikarmane et al.

(10) Patent No.: US 7,582,558 B2
(45) Date of Patent: Sep. 1, 2009

(54) REDUCING CORROSION IN COPPER DAMASCENE PROCESSES

(75) Inventors: Vinay B. Chikarmane, Portland, OR (US); Kevin J. Fischer, Hillsboro, OR (US); Brennan L. Peterson, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 339 days.

(21) Appl. No.: 11/486,871

(22) Filed: Jul. 14, 2006

(65) Prior Publication Data

US 2008/0014746 A1    Jan. 17, 2008

(51) Int. Cl.
*H01L 21/00* (2006.01)
(52) U.S. Cl. .................. 438/629; 438/633; 438/687
(58) Field of Classification Search ................. 438/687, 438/643, 637, 629, 633
See application file for complete search history.

(56) References Cited

U.S. PATENT DOCUMENTS

| 6,531,749 | B1* | 3/2003 | Matsuki et al. | 257/388 |
| 6,740,591 | B1 | 5/2004 | Miller et al. | 438/692 |
| 7,148,140 | B2* | 12/2006 | Leavy et al. | 438/666 |
| 2005/0090094 | A1* | 4/2005 | Oh et al. | 438/633 |
| 2006/0160349 | A1* | 7/2006 | Wong et al. | 438/618 |
| 2007/0054489 | A1* | 3/2007 | Wong et al. | 438/687 |
| 2007/0151860 | A1* | 7/2007 | Hong | 205/125 |

OTHER PUBLICATIONS

Flake et al., "Post CMP Passivation of Copper Interconnects", Motorola APRDL and AMD-Motorola Alliance.

* cited by examiner

*Primary Examiner*—Richard A. Booth
(74) *Attorney, Agent, or Firm*—Trop, Pruner & Hu, P.C.

(57) ABSTRACT

Copper interconnects may be made using the damascene process with reduced copper corrosion. Copper corrosion may be reduced by planarizing through excess copper down to, but not completely through, a copper diffusion barrier layer. The copper diffusion barrier layer may be removed using a different technique. Thereafter, suitable chemicals may be utilized to clean the structure.

7 Claims, 2 Drawing Sheets

REDUCING CORROSION IN COPPER DAMASCENE PROCESSES

BACKGROUND

This relates generally to the formation of integrated circuits and, particularly, to the formation of components such as interconnects using a copper damascene process.

Semiconductor processing may incorporate many fast switching transistors into an integrated circuit. One consequence of a large number of transistors on one integrated circuit is an increase in power consumption. One technique for increasing speed, while reducing power consumption, is to replace the traditional aluminum or aluminum alloy interconnects found on integrated circuits with a metal, such as copper, which offers lower electrical resistance. Reducing resistance may cause electrical signals to propagate more quickly through the interconnect pathways on an integrated circuit.

Furthermore, because the resistance of copper is less than that of aluminum, the cross-sectional area of copper interconnects may be smaller than those used with aluminum interconnects without incurring increased signal propagation delays based on the resistance of the interconnect. Additionally, because the capacitance between two electrical nodes is a function of the overlap area between those nodes, using a smaller copper interconnect line may result in a decrease in parasitic capacitance. In this way, replacing aluminum based interconnects with copper based interconnects may reduce resistance and capacitance for a given dimension of interconnect.

Thus, the use of copper, compared to aluminum, may have electrical advantages including lower resistance per cross-sectional area, the ability to provide for reduced parasitic capacitance, and greater immunity to electromigration. For these reasons, semiconductor manufacturers may find it desirable to include copper in their products. They may use copper as interconnects at various levels, including the formation of vias or contacts to integrated circuit transistor source drains.

Copper is difficult to integrated into semiconductor process fabrication because copper can adversely affect the performance of metal oxide semiconductor field effect transistors. If copper migrates or diffuses into the transistor areas of an integrated circuit, adverse consequences may result. Therefore, copper diffusion barriers are used to isolate the copper from transistor areas. Additionally, unlike aluminum based interconnect systems which are formed by a substractive etch process, copper interconnects are typically formed by damascene metal processes. In the damascene process, a trench is formed in a first layer and a metal layer is formed over the first layer including the trench. Excess metal is then processed off, leaving individual interconnect lines in the trenches. The removal of excess copper is typically accomplished by chemical mechanical planarization or polishing.

DETAILED DESCRIPTION

When forming copper interconnects using the damascene process, corrosion may be observed. It has been determined that one reason for the corrosion is the planarization through the copper layer, an underlying seed layer, and a copper diffusion barrier layer under the seed layer and over an interlayer dielectric. Copper exposure to either the planarization slurry and/or slurry cleaning chemicals contributes to corrosion. While many approaches have been suggested to reduce corrosion, including the inclusion of corrosion inhibitors in the chemical mechanical planarization slurries, corrosion still persists, absent additional preventive measures.

In some embodiments of the present invention, interconnects may be made with a copper damascene process by planarizing the excess copper down to, but not completely through, the copper diffusion barrier layer. The copper diffusion barrier layer may then be removed with other techniques, such as plasma etching, which have less adverse effects in terms of corrosion.

As long as a continuing sheet of the barrier is left behind at the conclusion of the chemical mechanical planarization process, the wafer may experience reduced galvanic effects in the chemical mechanical planarization cleaner steps since the entire layer is shorted, so that the amount of copper corrosion is reduced. Conventional copper chemical mechanical planarization steps remove the chemical overburden as well as the barrier. Removal of the diffusion barrier layer converts the shorted interconnect layer to a galvanically active layer and results in copper corrosion. Particularly in the formation of copper interconnects to source/drain and gate contacts, galvanic corrosion occurs as soon as the barrier layer is cleared in the chemical mechanical planarization process due to potential differences induced by the connection to N+ and P+ diffusion regions on the transistor.

Figure 1:
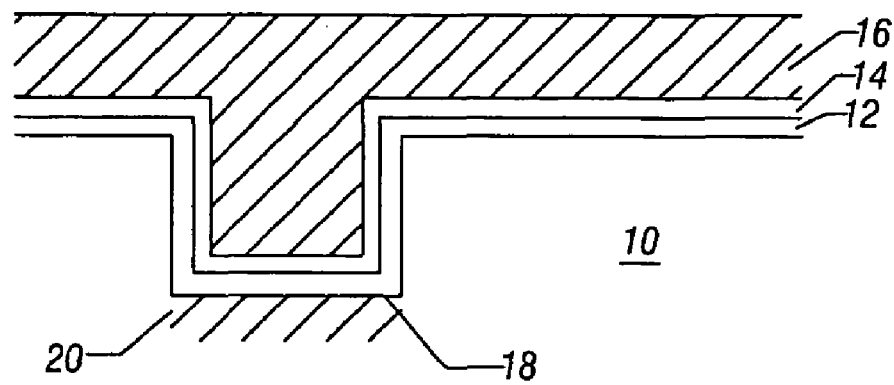
FIG. 1 is an enlarged, partial, cross-sectional view at an early stage of manufacture.

Referring to FIG. 1, an interlayer dielectric 10 may be formed over an underlying layer 20. The underlying layer 20 may include, for example, source/drain or gate contacts, to mention a few examples. The interlayer dielectric 10 is patterned to have a trench 18 formed therein. This is in accordance with the damascene process. Any conventional trenching technique may be utilized. The interlayer dielectric 10 may include any dielectric material including, but not limited to, silicon dioxide, fluorine doped silicon oxide, carbon doped silicon oxide, and materials other than oxide silicon such as, but not limited to, organic polymers and porous and organic materials.

Over the interlayer dielectric 10 and lining the trench 18 may be a copper diffusion barrier 12. Its function is to prevent copper from diffusing into sensitive electronic components and adversely affecting those components. A variety of different copper diffusion barriers 12 may be utilized, such as those including tantalum or tantalum nitride. Next, a copper seed layer 14 may be deposited over the copper diffusion layer 12. Thereafter, a copper layer 16 may be electroplated over the seed layer 14.

Figure 2:
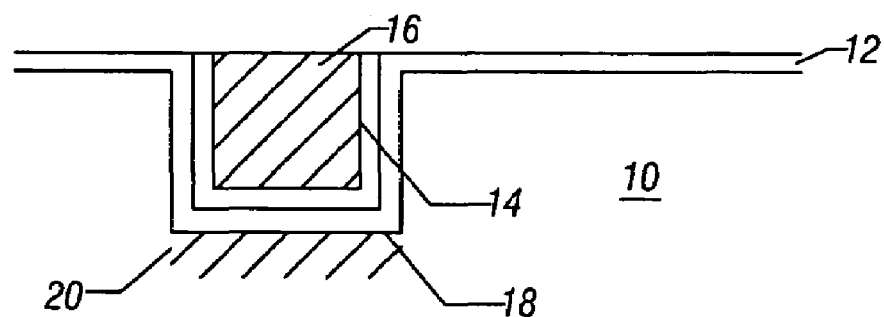
FIG. 2 is an enlarged, cross-sectional view at a subsequent stage in accordance with one embodiment of the present invention.

Referring to FIG. 2, chemical mechanical planarization may be used to remove the excess copper layer 16 and the excess seed layer 14 as shown in FIG. 2. Any of a variety well known copper chemical mechanical planarization slurries may be utilized for this purpose.

In a typical chemical mechanical planarization system, a wafer is placed face down on a rotating table, covered with a polishing pad which has been coated with a slurry. A carrier, which may be attached to a rotable shaft, is used to apply a downward force against the backside of the wafer. A retaining ring may be used to center the wafer onto the carrier and to prevent the wafer from slipping laterally. By applying the downward force and rotating the wafer, while simultaneously rotating a pad having a slurry thereon, a desired amount of material may be removed from the surface of a thin film.

The slurry may include a chelating organic acid buffer system in accordance with one embodiment. The slurry may, for example, have a small pH of approximately 3.8 in one embodiment.

Typically, an orbital polishing may be utilized, such as an IPEC 576 orbital polisher from Speed-Fam IPEC, 305 North 54$^{th}$ Street, Chandler, Ariz. 85226 and a downward force of approximately 3.75 psi may be utilized at a spindle speed of approximately 310 rpm, a wafer rotational speed of approximately 19 rpm, and a slurry flow rate of approximately 130 ccm and a delta P of 0.0 psi. Delta P is the pressure difference exerted on the top and bottom of the wafer, allowing fine control of the rate at the edge of the wafer. Stacked polishing pads, such as IC1000 with a suba-4 sub-pad made by Rodel, Inc. of 3804 East Watkins Street, Phoenix, Ariz. 85034 may be used with the slurry to polish copper films. Other commercially available polishing pads may be used as well. While the above examples are given, they are no way limiting on the scope of the present invention.

One suitable slurry may include $SiO_2$ abrasive, an $H_2O_2$ oxidizer, a benzotriazole corrosion inhibitor and citric acid/potassium citrate buffering. In one illustrative slurry, the citric acid/potassium citrate buffer system is provided by including in the slurry mixture approximately 3 g./l. citric acid and approximately 3 g./l. potassium citrate. One suitable abrasive is precipitated $SiO_2$. Precipitated $SiO_2$ is sometimes referred to as colloidal. An illustrative slurry may contain 5 weight percent silica, such as Klebesol 1498-50, available from Rodel, Inc., 3804 East Watkins Street, Phoenix, Ariz. 85034. The slurry may be formed from combining hydrogen peroxide with the slurry mixture such as the oxidizer comprises three percent by weight. In one embodiment, 0.015M benzotriazole may be utilized. Of course, any other suitable slurry composition may be utilized.

Instead of planarizing completely through the barrier layer 12, the process is stopped at the configuration shown in FIG. 2 with the barrier layer 12 still intact, even if partially planarized. The wafer may be transferred to a dry or plasma etching chamber 30. At this point, a blanket plasma etch back of the barrier layer is undertaken. The plasma or dry etch chemistry selectively etches the barrier layer while stopping on the interlayer dielectric. Most plasma etch chemistries that etch the barrier do not attack copper. Therefore, high selectivity of the barrier etch over copper may result from a wide range of etch chemistries. Suitable plasma etch chemistries include fluorine based chemistries.

Figure 3:
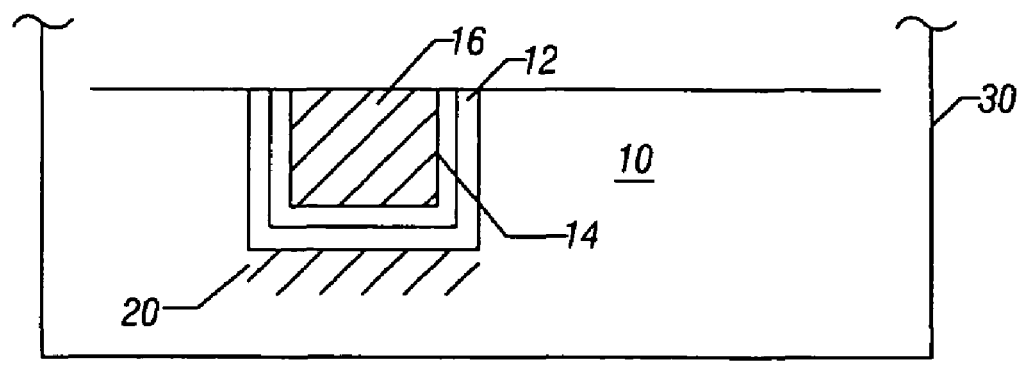
FIG. 3 is an enlarged, cross-sectional view of still a subsequent stage.

As a result of the plasma etch back, the structure shown in FIG. 3 results with the excess barrier layer 12 having been removed. Thereafter, a post etch back clean may be undertaken using water soluble organic solvents to remove particles plus a short spin-rinse-dry using deionized water to remove any organic residues. If needed, additives may be added to the deionized water to prevent or reduce copper corrosion. A suitable additive is 0.015M benzotriazole. Any suitable post-etch back clean water soluble organic solvents can be used. After the completion of this step, an etch stop may be deposited over the structure shown in FIG. 3.

Various techniques may be utilized for stopping on the barrier layer. For example, conventional end point detection may be used.

Figure 4:
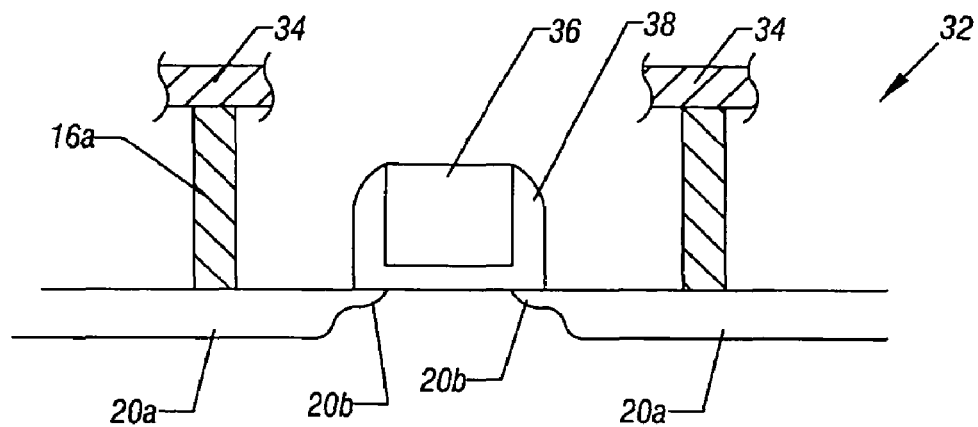
FIG. 4 is an enlarged, cross-sectional view of one embodiment of the present invention.

Referring to FIG. 4, according to one embodiment of the present invention, the copper layer 16 may be used to form the contacts 16a to the source/drains of a metal oxide semiconductor field effect transistor. Specifically, the contacts 16a may couple to a metallization 34 on one side and to a deeper source drain region 20a. The deeper source drain region 20a may electrically communicate with a shallower or tip source drain region 20b in some embodiments. A gate structure may include side wall spacers 38 and a gate electrode 36 in some embodiments. While one depiction shows a field effect transistor 32 of given architecture, any other architecture may be utilized as well.

Figure 5:
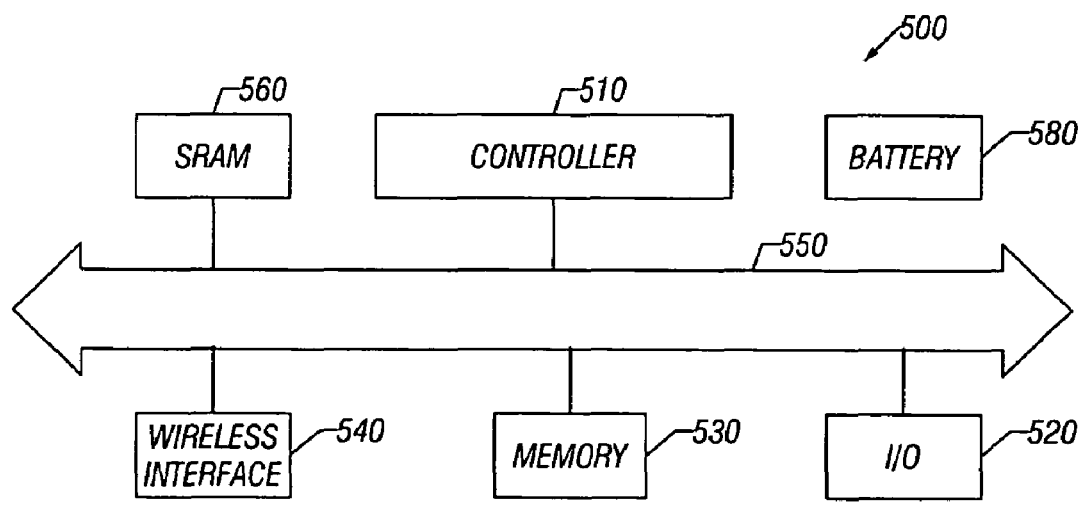
FIG. 5 is a system depiction for one embodiment.

Referring to FIG. 5, in some embodiments, the transistors 32, shown in FIG. 4, may be used to form any of the devices shown in the processor-based system 500 of FIG. 5 including a controller 510, such as a processor, a memory 530, input/output devices 520, wireless interface 540, or static random access memory (SRAM) 560. Thus, in FIG. 5, the controller 510 is coupled through a bus 550 to the input/output device 520, the memory 530, the wireless interface 540, and the SRAM 560. The whole structure may be powered by the battery 580. Of course, other devices and other system architectures may benefit from the use of embodiments of the present invention.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   forming a copper material in a trench in an interlayer dielectric;
   forming a copper diffusion barrier layer between said trench and said copper material and over the interlayer dielectric, said copper diffusion barrier including an excess extending over said dielectric outside said trench;
   planarizing said excess, but not planarizing through said excess, to form a remainder of said barrier; and
   removing said remainder using a technique other than planarization.

2. The method of claim 1 including removing said remainder with a plasma etch.

3. The method of claim 2 including using a plasma etch which is selective of the remainder relative to said dielectric.

4. The method of claim 2 including forming a copper diffusion barrier layer including tantalum.

5. The method of claim 2 including providing a seed layer between the copper diffusion barrier layer and the copper material.

6. The method of claim 1 including cleaning, after using a technique other than planarizing to remove the remainder, using water soluble organic solvents.

7. The method of claim 1 including using said copper material to form source drain contacts.

* * * * *